United States Patent
Liu et al.

(10) Patent No.: US 10,937,900 B2
(45) Date of Patent: Mar. 2, 2021

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Po-Chun Liu, Hsinchu (TW); Chi-Ming Chen, Hsinchu County (TW); Yao-Chung Chang, Hsinchu County (TW); Jiun-Lei Jerry Yu, Hsinchu County (TW); Chen-Hao Chiang, Taoyuan County (TW); Chung-Yi Yu, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/136,309

(22) Filed: Apr. 22, 2016

(65) Prior Publication Data

US 2017/0222032 A1    Aug. 3, 2017

Related U.S. Application Data

(60) Provisional application No. 62/288,820, filed on Jan. 29, 2016.

(51) Int. Cl.
*H01L 29/20* (2006.01)
*H01L 29/66* (2006.01)
(Continued)

(52) U.S. Cl.
CPC ...... *H01L 29/7787* (2013.01); *H01L 29/2003* (2013.01); *H01L 29/4966* (2013.01); *H01L 29/66462* (2013.01)

(58) Field of Classification Search
CPC .............................. H01L 29/778; H01L 29/20
See application file for complete search history.

(56) References Cited

U.S. PATENT DOCUMENTS

| 6,617,060 B2 | 9/2003 | Weeks, Jr. et al. |
| 2002/0074552 A1* | 6/2002 | Weeks, Jr. ............ C30B 23/02 257/76 |

(Continued)

FOREIGN PATENT DOCUMENTS

| CN | 104241400 A | 12/2014 |
| CN | 104704637 A | 6/2015 |

OTHER PUBLICATIONS

Effect of growth conditions on the Al composition and quality of AlGaN film, Materials Science and Engineering B 136 (2007) 29-32.

*Primary Examiner* — Joseph C. Nicely
*Assistant Examiner* — Lamont B Koo
(74) *Attorney, Agent, or Firm* — Haynes and Boone, LLP

(57) ABSTRACT

The present disclosure provides a semiconductor structure, including a substrate, a first III-V layer over the substrate, having a first band gap, and a second III-V layer over the first III-V layer, having a second band gap. The second III-V layer includes a first surface in contact with the first III-V layer and a second surface opposite to the first surface. The second band gap at the second surface is greater than the second band gap at the first surface. The present disclosure also provides a manufacturing method of the aforesaid semiconductor structure.

20 Claims, 21 Drawing Sheets

(51) Int. Cl.
   *H01L 29/778*   (2006.01)
   *H01L 29/49*    (2006.01)

(56) References Cited

U.S. PATENT DOCUMENTS

| | | |
|---|---|---|
| 2002/0195619 A1 | 12/2002 | Makimoto et al. |
| 2003/0218183 A1* | 11/2003 | Micovic ............ H01L 21/28575 257/192 |
| 2006/0231860 A1 | 10/2006 | Mishra et al. |
| 2009/0072272 A1 | 3/2009 | Suh et al. |
| 2010/0224911 A1* | 9/2010 | Okita .................... H01L 29/432 257/194 |
| 2010/0270591 A1* | 10/2010 | Ahn .................... H01L 29/7782 257/194 |
| 2013/0313612 A1* | 11/2013 | Khalil ................ H01L 29/4236 257/194 |
| 2014/0203289 A1* | 7/2014 | Liu ....................... H01L 29/432 257/76 |
| 2014/0231816 A1* | 8/2014 | Chiu ................... H01L 29/2003 257/76 |
| 2014/0252369 A1* | 9/2014 | Lee ..................... H01L 29/7787 257/76 |
| 2014/0361345 A1* | 12/2014 | Kaneko .............. H01L 29/2003 257/200 |
| 2014/0374771 A1* | 12/2014 | Umeno ................ H01L 29/201 257/76 |
| 2015/0021661 A1 | 1/2015 | Chen et al. |
| 2016/0268410 A1* | 9/2016 | Onizawa ............. H01L 29/404 |

* cited by examiner

|  | Al 23% | Al 18% | Al 16% |
|---|---|---|---|
| $R_{dson}$ (mohm*cm$^2$) | 2.2 | 2.8 | 3.1 |
| Burn out rate | >20% | 5% | 0% |

FIG. 1

SEMICONDUCTOR STRUCTURE AND MANUFACTURING METHOD THEREOF

CROSS-REFERENCE TO RELATED APPLICATIONS

This application is a non-provisional application claiming the priority of U.S. Application No. 62/288,820, filed Jan. 29, 2016.

FIELD

The present disclosure relates to a semiconductor structure containing a HEMT or a MISFET and manufacturing method thereof.

BACKGROUND

In semiconductor technology, due to their characteristics, Group III-Group V (or III-V) semiconductor compounds are used to form various integrated circuit devices, such as high power field-effect transistors, high frequency transistors, or high electron mobility transistors (HEMTs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility, the ability to transmit signals at high frequencies, etc.

Among several technical requirements on an efficient power switch, a critical one is obtaining a very low ON resistance ($R_{ON}$) immediately after switching from a high-voltage OFF state to a low-voltage ON state. Another critical requirement is to obtain a low device burnout rate. Device burnout is an undesirable phenomenon which may occur in FETs at elevated source-drain voltage levels and which results in irreversible electrical breakdown of a device. Usually, burnout is accompanied by microscopically visible damage at the drain contact edge.

Therefore, the process for making semiconductor structures containing HEMT and MISFET devices need to be improved continuous to ensure high level performance and production yield.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 shows dynamic on-resistance and device burn out rate in accordance with different aluminum concentrations in a III-V layer of a semiconductor device, according to some embodiments of the present disclosure;

DETAILED DESCRIPTION OF THE INVENTION

Figure 2:
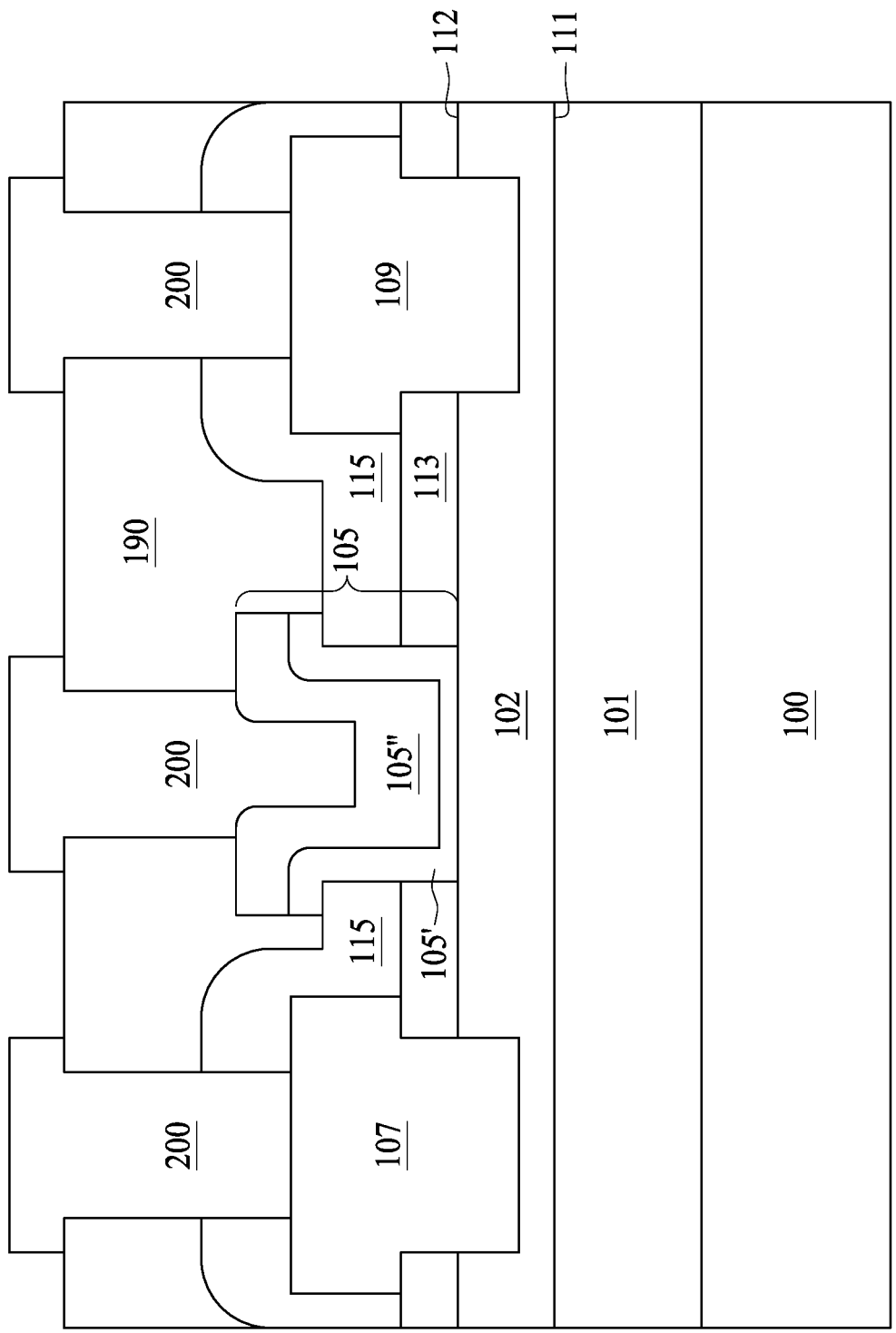
FIG. 2 shows a schematic cross-sectional view of a semiconductor structure, according to some embodiments of the present disclosure.

In the drawings, like reference numbers are used to designate like or similar elements throughout the various views and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The term "metal-insulator-semiconductor Field Effect Transistor (MISFET)" used herein refers to any equivalents of insulated gate field-effect transistor. The insulator in the MISFET is a dielectric which can be silicon oxide, silicon nitride, gallium oxide, aluminum oxide, scandium oxide, zirconium oxide, lanthanum oxide, hafnium oxide or the like.

The term "High Electron Mobility Transistor (HEMT)" used herein refers to field effect transistors including a junction between two materials with different band gaps as the channel instead of a doped region. The HEMT may or may not include an insulated gate.

Low device burn out rate and low dynamic on-resistance ($R_{dson}$) are desirable features to a MISFET or a HEMT. The property of the III-V layer in contact with the gate structure, however, plays a crucial role in affecting the aforesaid features. For example, in a GaN HEMT, the donor-supply layer containing AlGaN would render a satisfying $R_{dson}$ if the aluminum concentration (in atomic percent herein) is high enough. However, the high aluminum concentration in the AlGaN unavoidably raises the device burn out rate. Therefore, the concentration of the group III material in the donor-supply layer pose a tradeoff at least with respect to the $R_{dson}$ and the device burn out rate.

Referring to FIG. 1, FIG. 1 shows dynamic on-resistance ($R_{dson}$) and device burn out rate in accordance with different aluminum concentrations in a III-V layer of a semiconductor device. In some embodiments, the III-V layer is composed of ternary compound semiconductor material such as AlGaN. The Al-containing III-V layer is a donor-supply layer that is disposed over a channel layer. In the case where the aluminum (Al) concentration is about 23%, the $R_{dson}$ about 2.2. This $R_d$ is relatively low compared to another case where the Al concentration is about 16%. A trend can be observed from the form of FIG. 1 that the higher the Al concentration in the AlGaN, the lower, or the more satisfying $R_{dson}$. However, the higher the Al concentration also increases the device burn out rate. In the contrary, the lower the Al concentration in the AlGaN, the lower, or the more satisfying device burn out rate, but accompanied with a greater $R_{dson}$.

The tradeoff between the $R_{dson}$ and the device burn out rate is clearly relevant to the Al concentration in the donor-supply layer. It is accepted that crystal quality of the AlGaN is crucial to the device burn out rate. In other words, better crystal quality of the AlGaN leads to lower device burn out rate. High Al concentration AlGaN film is considered hard to obtain good crystal quality, hence, higher Al concentration inclines to burn out devices. If heading to the opposite direction, that is, decreasing Al concentration in the AlGaN, the concentration of 2-dimensional electron gas (2DEG) cannot be sustained to an appropriate value that does not impact device performance.

The present disclosure provides a semiconductor structure having a second III-V layer disposed over a first III-V layer. The second III-V layer has a variable band gap which is smaller toward the side in proximity to the first III-V layer and greater toward the side in opposite direction.

The present disclosure provides a semiconductor structure having an Al-containing layer over a GaN layer and a gate structure over the Al-containing layer. The Al concentration of the Al-containing layer in proximity to the GaN layer is different from the Al concentration of the Al-containing layer in proximity to the gate structure.

The present disclosure provides a manufacturing method of a semiconductor structure. The method includes forming a first III-V layer having a first band gap over a substrate and forming a second III-V layer having a second band gap over the first III-V layer. The second III-V layer having a first surface in contact with the first III-V layer and a second surface opposite to the first surface. The second band gap at the second surface is greater than the second band gap at the first surface.

Referring to FIG. 2, FIG. 2 shows a schematic cross-sectional view of a semiconductor structure 10, according to some embodiments of the present disclosure. In FIG. 2, the semiconductor structure 10 includes a substrate 100, a first III-V layer 101 over the substrate 100, and a second III-V layer 102 over the first III-V layer 101. A gate structure 105 is disposed over the second III-V layer 102 and between a corresponding source feature 107 and a drain feature 109. In some embodiments, the first III-V layer 101 possesses a first bandgap, and the second III-V layer 102 possesses a second bandgap. The first bandgap is different from the second bandgap. In some embodiments where the first III-V layer includes GaN and the second III-V layer includes AlGaN, the first bandgap is smaller than the second bandgap. In some embodiments where the fist III-V layer includes GaAs and the second III-V layer includes AlGaAs, the first bandgap is smaller than the second bandgap.

The semiconductor structure 10 includes a heterojunction formed between two different semiconductor material layers, such as material layers with different band gaps. For example, the semiconductor structure 10 includes a non-doped narrow-band gap channel layer and a wide-band gap n-type donor-supply layer. In at least one embodiment, the semiconductor structure 10 includes a first III-V layer 101 (or referred to as a channel layer) formed on the substrate 100 and a second III-V layer 102 (or referred to as a donor-supply layer) formed on the channel layer. The channel layer and the donor-supply layer are compounds made from the III-V groups in the periodic table of elements. However, the channel layer 101 and the donor-supply layer 102 are different from each other in composition. The channel layer 101 is undoped or unintentionally doped (UID). In the present example of the semiconductor structure 10, the channel layer 101 includes a gallium nitride (GaN) layer. The donor-supply layer 102 includes an aluminum gallium nitride (AlGaN) layer. The GaN layer and AlGaN layer directly contact each other. In another example, the channel layer 101 includes a GaAs layer or InP layer. The donor-supply layer 102 includes an AlGaAs layer or an AlInP layer.

In some embodiments, the bandgap of the second III-V layer 102 is not a constant throughout the layer. For example, the second III-V layer 102 has a first surface 111 in contact with the first III-V layer 101 and a second surface 112 opposite to the first surface 111. As shown in FIG. 2, a bottom of the gate structure 105 is substantially disposed on the second surface 112. That is, the second surface 112 of the first III-V layer is in proximity to the gate structure. The second III-V layer 102 includes a graded $Al_zGa_{(1-z)}N$ materials with an Al concentration at the first surface 111 smaller than an Al concentration at the second surface 112. Alternatively stated, the Z at the first surface 111 is smaller than the Z at the second surface 112. The grading profile includes multiple variations such as a stair profile, a linear continuous profile, or a non-linear continuous profile.

In some embodiments, the Z at the first surface 111 is in a range of from about 0.14 to about 0.18, and the Z at the second surface 112 is in a range of from about 0.35 to about 0.4. Even the portion containing the least Al in the second III-V layer 102 has a greater second bandgap than the first bandgap of the first III-V layer 101.

The GaN layer 101 is undoped. Alternatively, the GaN layer 101 is unintentionally doped, such as lightly doped with n-type dopants due to a precursor used to form the GaN layer 101. In one example, the GaN layer 101 has a thickness in a range from about 0.5 microns to about 10 microns. The AlGaN layer 102 is intentionally doped. In one example, the AlGaN layer 102 has a thickness more than 20 nanometers.

The semiconductor structure 10 also includes a set of source feature and drain feature (107 and 109). The source feature 107 and the drain feature 109 can be respectively disposed on the AlGaN layer 102 or lower than a top surface of the AlGaN layer 102. Each of the source feature and the drain feature comprises a metal feature. In one example, the metal feature is free of Au and comprises Al, Ti, or Cu. These source feature and drain feature are placed in a semiconductor structure 10 of a MISFET.

The semiconductor structure 10 further includes a dielectric cap layer 113 disposed on a top surface of the AlGaN layer 102 not occupied by the metal features or the gate structure. In the semiconductor structure 10 of a MISFET, the dielectric cap layer 113 fills an opening that exposes a portion of the AlGaN layer 102 for a gate electrode formation. The dielectric cap layer 113 protects the underlying AlGaN layer 102 from damage in the subsequent operations having plasma.

In some embodiments, the semiconductor structure 10 further includes a protection layer 115. The protection layer is disposed on top surfaces of the metal features 107/109 and under a gate dielectric layer 105'. The protection layer further includes an opening that aligns with the opening in the dielectric cap layer 113. The combined opening of the opening in the protection layer and the opening in the dielectric cap layer 113 exposes the portion of the AlGaN layer 102 for the gate electrode formation. The protection layer also covers the source feature and the drain feature, and prevents the source feature and the drain feature from exposure during subsequent annealing operation.

On the semiconductor structure 10 of a MISFET, it also includes a gate electrode 105" disposed on the opening over AlGaN layer 102 between the source and drain features. The gate electrode 105" includes a conductive material layer configured for voltage bias and electrical coupling with the carrier channel. In this embodiment, the conductive material is disposed on top of a gate dielectric layer 105'. In various examples, the conductive material layer includes a refractory metal or its compounds, e.g., titanium (Ti), titanium nitride (TiN), titanium tungsten (TiW) and tungsten (W). In another example, the conductive material layer includes nickel (Ni), gold (Au) or copper (Cu).

Figure 3:
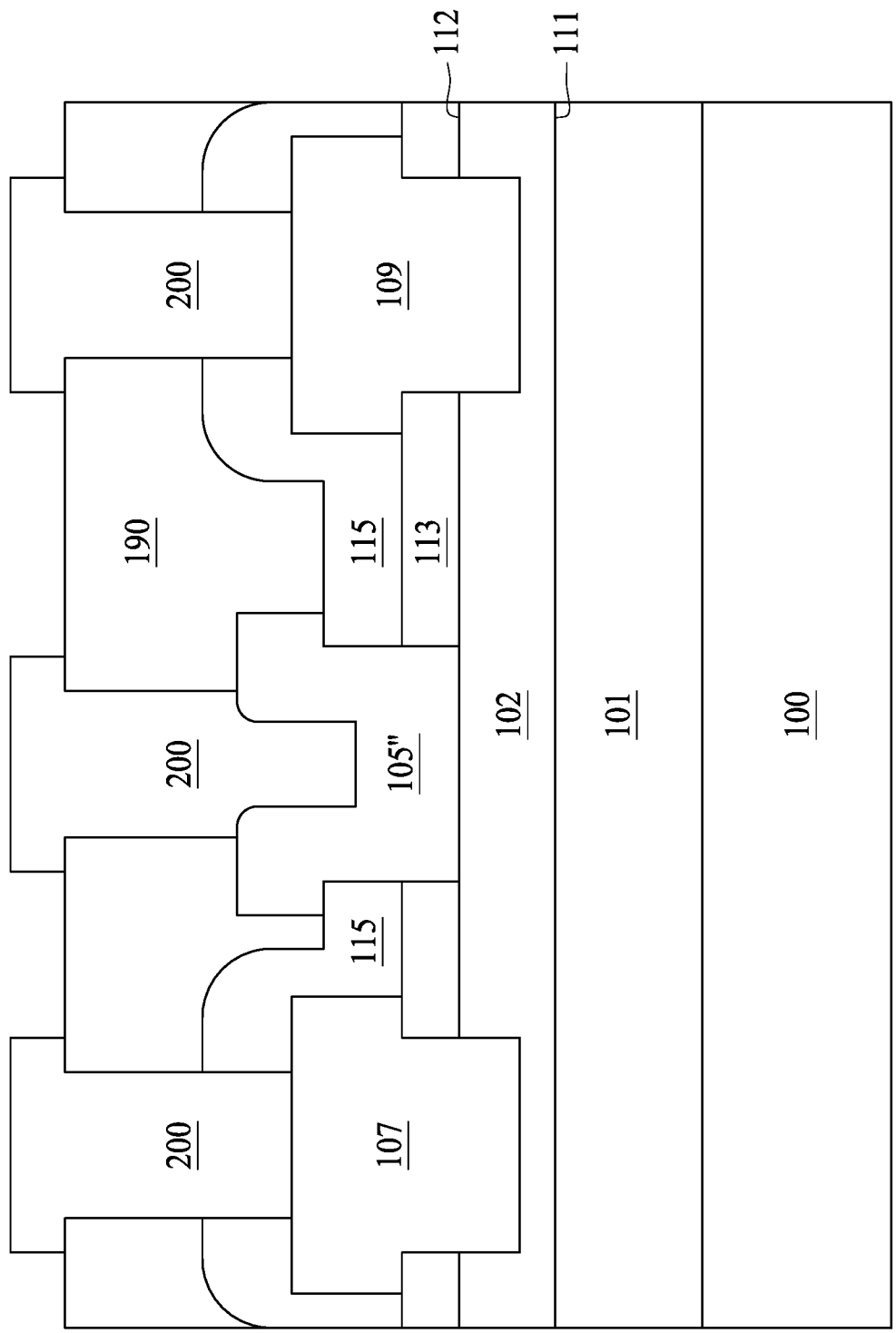
FIG. 3 shows a schematic cross-sectional view of a semiconductor structure, according to some embodiments of the present disclosure.

Referring to FIG. 3, FIG. 3 shows a schematic cross-sectional view of a semiconductor structure 20, according to some embodiments of the present disclosure. On the semiconductor structure 20 of HEMT, it includes a gate electrode 105" disposed on the opening over AlGaN layer 102 between the source and drain features. Here, since there is no gate dielectric layer 105" disposed in the opening above AlGaN layer 102, the gate electrode 105" is in direct contact with the AlGaN layer 102. The gate electrode 105" also includes a conductive material layer configured for voltage bias and electrical coupling with the carrier channel. In various examples, the conductive material layer includes a refractory metal or its compounds, e.g., titanium (Ti), titanium nitride (TiN), titanium tungsten (TiW) and tungsten (W). In another example, the conductive material layer includes nickel (Ni), gold (Au) or copper (Cu).

Figure 4:
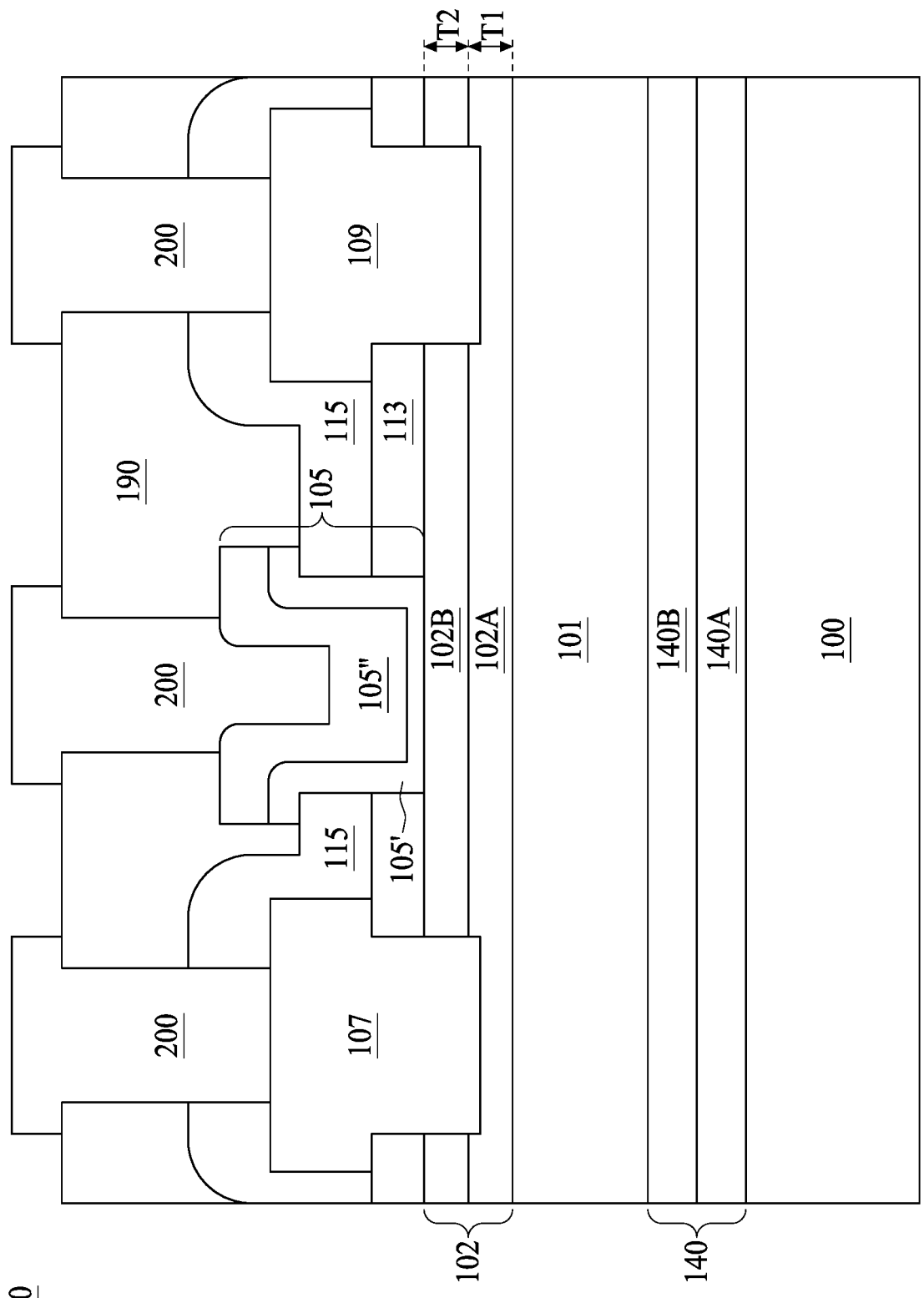
FIG. 4 shows a schematic cross-sectional view of a semiconductor structure, according to some embodiments of the present disclosure.

Referring to FIG. 4, FIG. 4 shows a schematic cross-sectional view of a semiconductor structure 30, according to some embodiments of the present disclosure. In FIG. 4, the second III-V layer 102 further includes a bilayer structure, including, for example, a bottom layer 102A and an upper layer 102B. The Al concentration in the upper layer 102B is greater than that in the bottom layer 102A. In some embodiments, the Al concentration in the bottom layer 102A is in a range of from about 0.14 to about 0.18 and forms a concentration uniform layer. In some embodiments, the Al concentration in the upper layer 102B is in a range of from about 0.23 to about 0.40 and forms a concentration uniform layer. However, the concentration profile in each of the upper layer 102B and the bottom layer 102A may not be uniform layer-wide. That is, the Al concentration in each of the upper layer 102B and the bottom layer 102A can be graded in various profile described as long as the increase of the Al concentration is from the bottom to the top of said layer.

If the Al concentration of the bottom layer 102A is lower than 0.14, the concentration of the 2DEG is not enough to sustain a good device performance since the second III-V layer 102 is a donor-supply layer. If the Al concentration of the bottom layer 102A is greater than 0.18, the crystal quality of the AlGaN layer is deteriorated, as can be measured by photoluminescence test (PL) and the full-width-half-maximum (FWHM) of the X-ray diffraction peaks. Especially the bottom layer 102A is suitable for a thickness greater than about 15 nm, such thickness may exceed the critical thickness of $Al_{0.08}Ga_{0.82}N$ and generate undesirable crystal quality. Inferior crystal quality induces high device burn out rate.

If the Al concentration of the upper layer 102B is greater than 0.4, the crystal quality of the AlGaN layer is deteriorated, as can be measured by photoluminescence test (PL) and the full-width-half-maximum (FWHM) of the X-ray diffraction peaks. Especially the upper layer 102B is suitable for a thickness thinner than about 5 nm, such thickness may exceed the critical thickness of $Al_{0.4}Ga_{0.6}N$ and generate undesirable crystal quality. It is discussed that inferior crystal quality induces high device burn out rate. If the Al concentration of the upper layer 102B is lower than 0.23, the $R_{dson}$ is increased due to the fact that the energy barrier of the upper layer 102B is not high enough to confine the carriers at the heterointerface.

In some embodiments, the bottom layer 102A possesses a thickness T1 and the upper layer 102B possesses a thickness T2. In some embodiments, the thickens T2 is smaller than thickness T1. For example, a summation of the thickens T1 and the thickness T2 can be about or greater than 20 nm in order to preserve the process window for the subsequent source feature and drain feature. In some embodiments, a ratio of the thickness T1 and thickness T2 is about 3. In some embodiments, the thickness T1 is in a range of from about 15 nm to 20 nm, whereas the thickness T2 is less than 5 nm, for example, from about 2 nm to about 5 nm. If the thickness T2 is thicker than 5 nm, for example, reaching 10 nm, the crystal quality is deteriorated due high aluminum concentration (i.e., 23% to 40%). It is thus determined that the upper layer 102B shall be equal to or thinner than about 5 nm, while the bottom layer 102A shall be equal to or greater than 15 nm in order to provide sufficient process window for subsequent ohmic contact formation between the source/drain feature and the bottom layer 102A.

In FIG. 4, a buffer layer 140 is deposited over the substrate 100. In some embodiments, the buffer layer 140 provides a gradual change of lattice constants between that of the substrate 100 and that of the first III-V layer 101. For a case where the substrate 100 is composed of silicon and the first III-V layer 101 is composed of AlGaN, the buffer layer 140 can be composed of a bilayer or a multi-layer. For example, a AlN layer 140A which has a closer lattice constant to the substrate 100, and a AlGaN layer 140B having a closer lattice constant to the first III-V layer 101. However, this is not a limitation to the present disclosure. Other types of the buffer layers can be applied according to the heteroepitaxy technique in the art.

Figure 5:
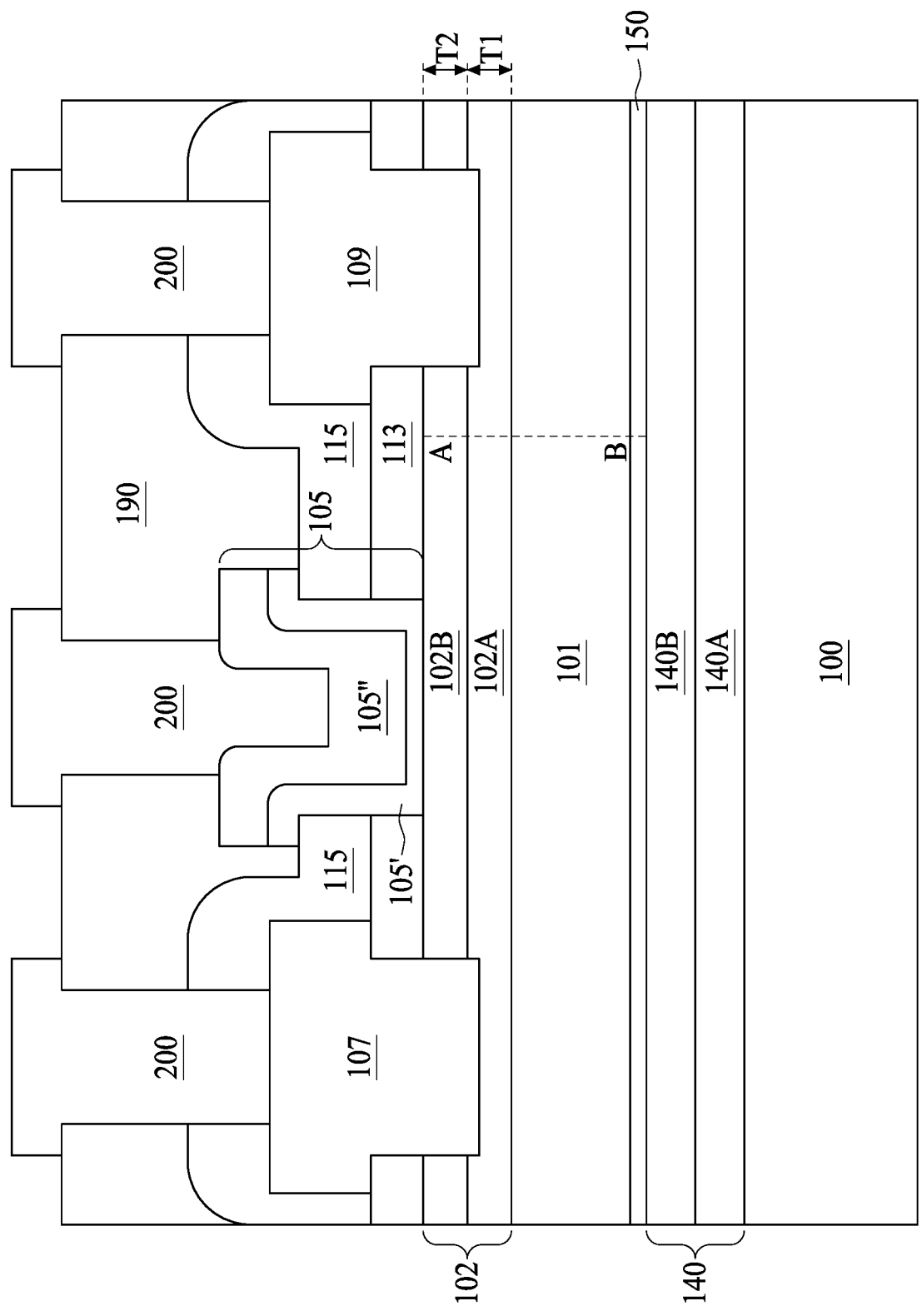
FIG. 5 shows a schematic cross-sectional view of a semiconductor structure, according to some embodiments of the present disclosure.

FIG. 5 shows a schematic cross-sectional view of a semiconductor structure 40, according to some embodiments of the present disclosure. In FIG. 5, the semiconductor structure 40 is similar to the semiconductor structure 30 except for an additional high bandgap material layer 150 between the first III-V layer 101 and the buffer layer 140. In some embodiments, the high bandgap material layer 150 is a thin epitaxy layer of about 1 nm. Depending on the material system used in the semiconductor structure 40, the high bandgap material layer 150 can be an AlN layer when the semiconductor structure 40 is a HEMT or a MISFET with a GaN channel layer and an AlGaN donor supply layer. As shown in FIG. 5, an aluminum concentration along dotted line AB in an energy dispersed X-ray spectroscopy (EDX) scanning demonstrates a first peak at the upper layer 102B of the second III-V layer and a comparable second peak at the high bandgap material layer 150.

Figure 6:
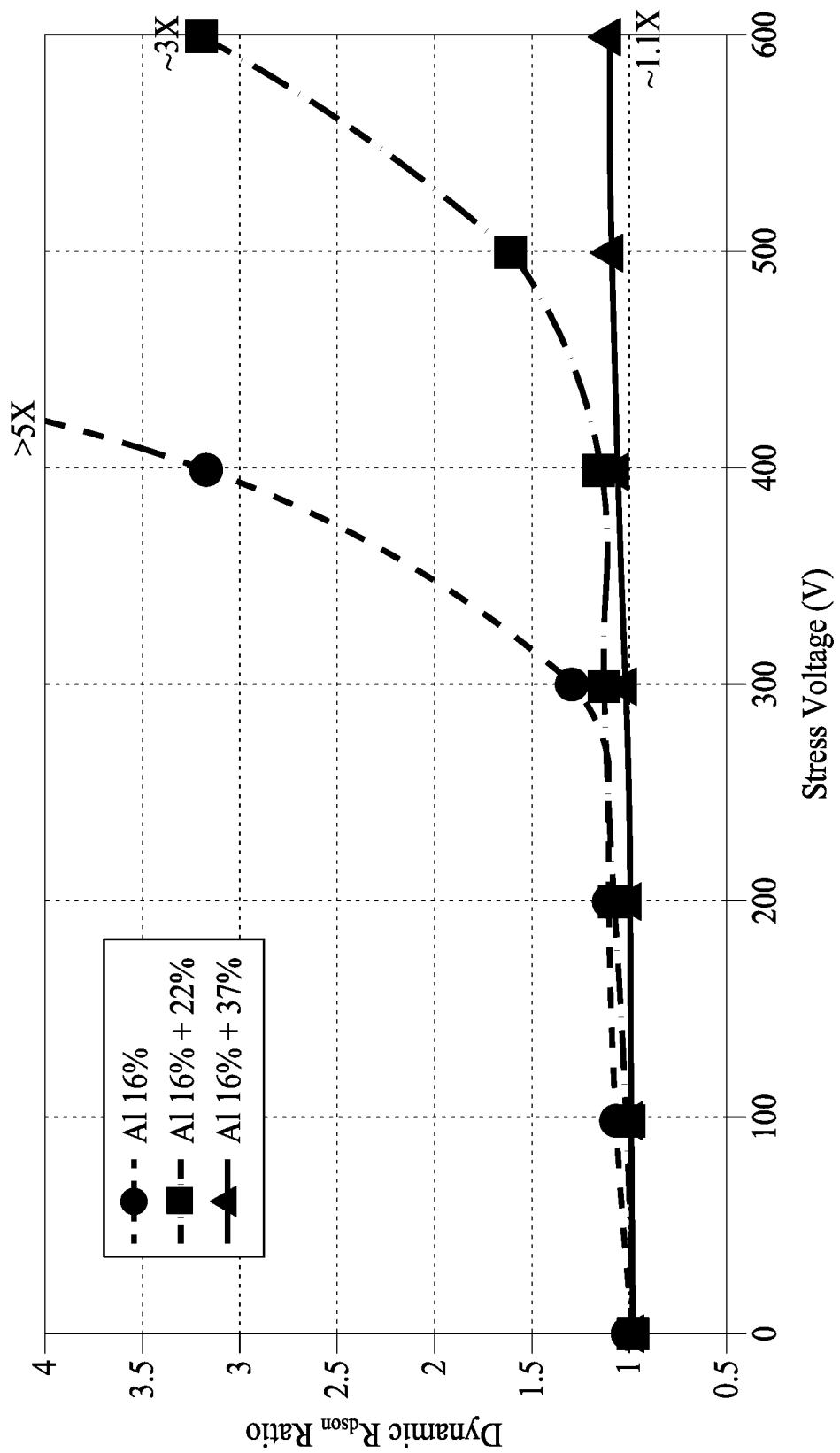
FIG. 6 is a diagram showing dynamic on-resistance ratio as a function of stress voltage with respect to different aluminum concentrations in a III-V layer of various semiconductor structures, according to some embodiments of the present disclosure.

FIG. 6 is a diagram showing dynamic on-resistance ratio as a function of stress voltage with respect to different aluminum concentrations in a III-V layer of various semiconductor structures, according to some embodiments of the present disclosure. In FIG. 6, three semiconductor structures are demonstrated, having an aluminum concentration at the upper layer 102B of the second III-V layer of 16% (solid circle line), 22% (solid square line), and 37% (solid triangle line), respectively. The vertical axis, dynamic on resistance ratio, is the ratio of a device ON resistance between an initial low-voltage ON state and a low-voltage ON state after a high voltage stress. The horizontal axis shows the stress voltage. It is shown that when the stress voltage is increased to about 600V, the greater the aluminum concentration at the upper layer 102B of the second III-V layer, the lower the $R_{dson}$. For example, the solid circle line represents the conventional semiconductor structure where the second III-V layer 102 is a single layer with a fixed aluminum composition of 16%. The dynamic on resistance ratio of which exceeds about 5 under the stress voltage of 600V. The solid square line represents one embodiment of the present disclosure where the second III-V layer 102 is a bilayer with an aluminum composition of 16% at the bottom layer 102A and of 22% at the upper layer 102B. The dynamic on resistance ratio of which is about 3 under the stress voltage of 600V. The solid triangle line represents one embodiment of the present disclosure where the second III-V layer 102 is a bilayer with an aluminum composition of 16% at the bottom layer 102A and of 37% at the upper layer 102B. The dynamic on resistance ratio of which is about 1.1 under the stress voltage of 600V. It is shown that given the identical bottom layer 102A, the dynamic on resistance effectively decreases when the aluminum concentration at the upper layer 102B increases. Hence, the present disclosure provides a high aluminum concentration upper layer 102B having an aluminum concentration of from about 23% to about 40% at a predetermined thickness range to preserve crystal quality of the upper layer 102B as described above.

Figure 7:
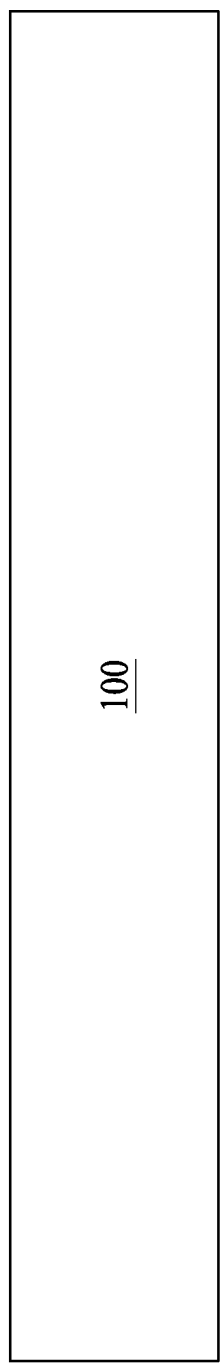
FIG. 7 to FIG. 10 show schematic cross-sectional views of a semiconductor structure and depict the sequence of operations for fabrication of the semiconductor structure, according to some embodiments of the present disclosure.
Figure 8:
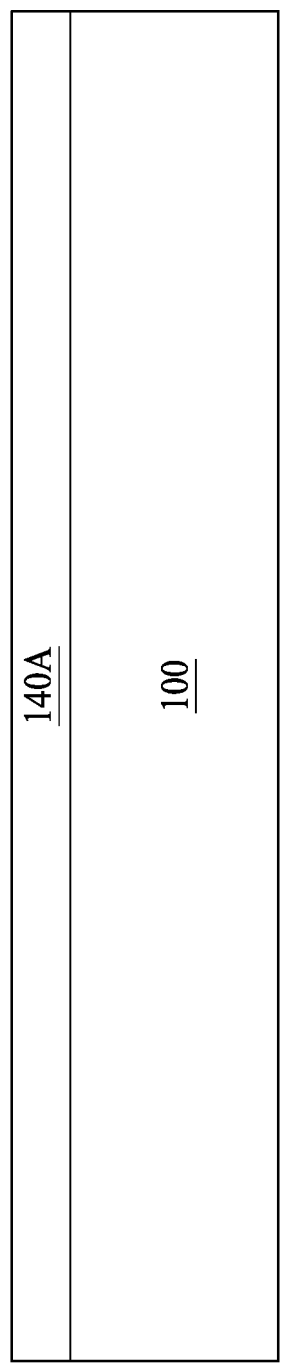
Figure 9:
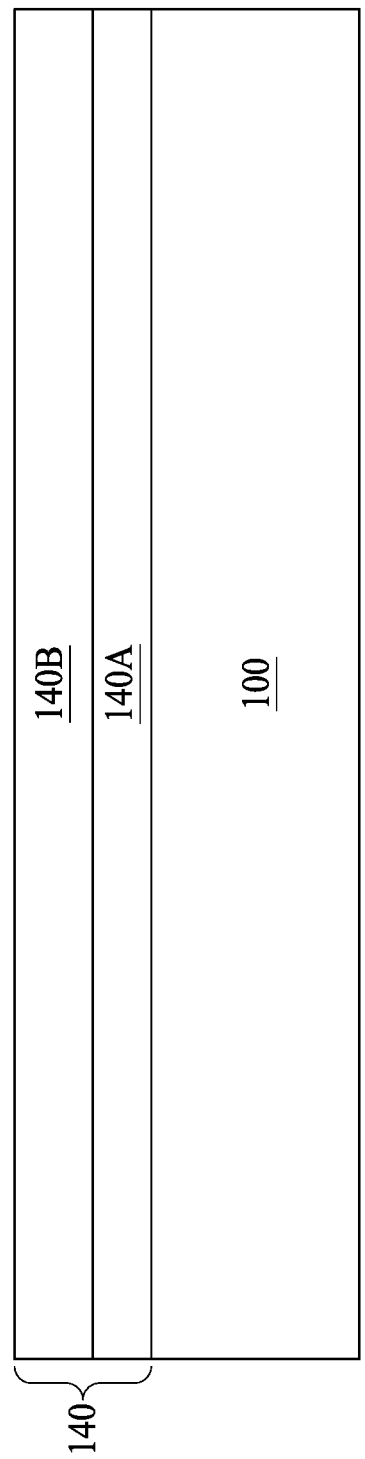

FIG. 7 to FIG. 10 show schematic cross-sectional views of a semiconductor structure and depict the sequence of operations for fabrication of the semiconductor structure 10, according to some embodiments of the present disclosure. In FIG. 7, a substrate 100 is provided. In some embodiments, the substrate 100 includes a silicon carbide (SiC) substrate, sapphire substrate or a silicon substrate. In FIG. 8, a bottom layer 140A of a bilayer buffer layer 140 is formed over the substrate 100. In some embodiments, the bottom layer 140A can be an MOCVD- or MBE-grown AlN layer grown on a (111) silicon substrate. In FIG. 9, an upper layer 140B of the bilayer buffer layer 140 is formed over the bottom layer 140A. In some embodiments, the upper layer 140B can be an MOCVD- or MBE-grown AlGaN layer.

Figure 10:
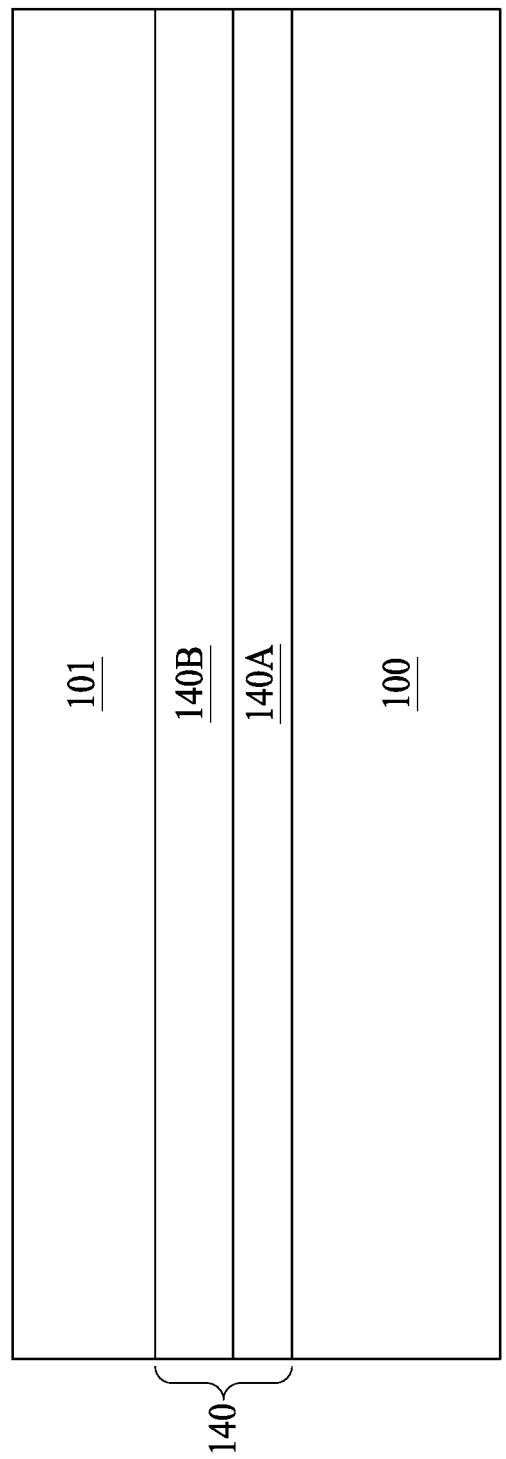

Referring to FIG. 10, a first III-V layer 101 is epitaxially grown over the buffer layer 140. In some embodiments, the first III-V layer 101 can be an MOCVD- or an MBE-grown GaN layer at a temperature range of from about 900 to about 1050 degrees Celsius and under a pressure range of from about 50 to about 500 mbar. The first III-V layer 101 includes a first band gap. In some embodiments, the first III-V layer 101 can be epitaxially grown by metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiarybutylamine (TBAm), phenyl hydrazine, or other suitable chemical. The suitable aluminum composition of the first III-V layer 101 is addressed above and is not repeated here for simplicity. In some embodiments, the first III-V layer 101 has a thickness in a range from about 0.5 micron to about 10 microns. In other embodiments, the first III-V layer 101 may include a GaAs layer or an AlN layer. In some embodiments of the present disclosure, a high bandgap material such as an AlN can be formed on the buffer layer 140 prior to the formation of the first III-V layer 101.

Figure 11A:
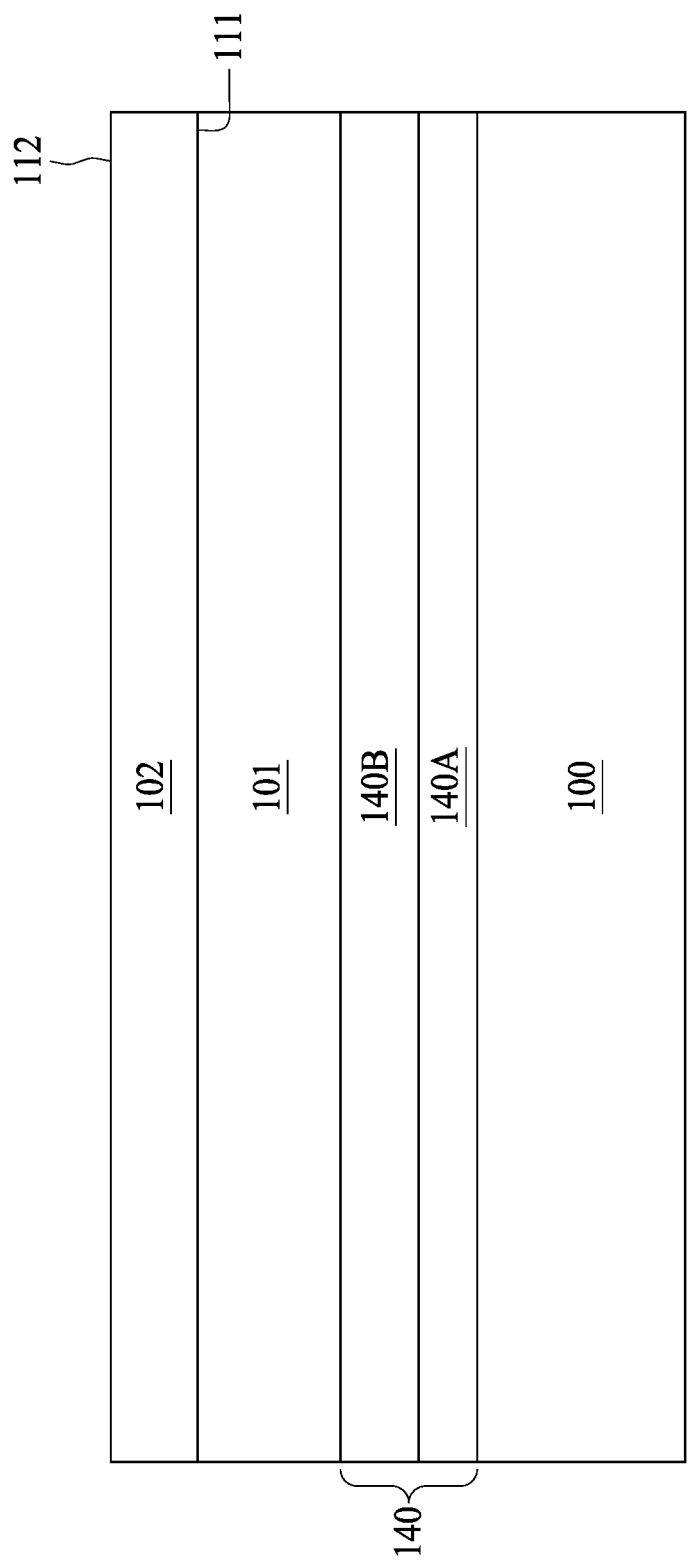
FIG. 11A shows a schematic cross sectional view of a semiconductor structure with one type of a III-V layer during an operation of fabrication, in according to some embodiments of the present disclosure.

Referring to FIG. 11A, FIG. 11A shows a schematic cross sectional view of a semiconductor structure 10 with one type of a second III-V layer 102 during an operation of fabrication, according to some embodiments of the present disclosure. The second III-V layer 102 includes a second band gap. In FIG. 11A, a second III-V layer 102 is formed over the first III-V layer 101. The second III-V layer 102, also referred to as donor-supply layer, is grown on first III-V layer 101. In at least one embodiment, the second III-V layer 102 refers to an aluminum gallium nitride (AlGaN) layer. In some embodiments, the second III-V layer 102 is epitaxially grown on the first III-V layer 101 by MOVPE using aluminum-containing precursor, gallium-containing precursor, and nitrogen-containing precursor under conditions, for example, a temperature of from 1000 to 1100 degrees Celsius and a pressure of from 50 to 100 mbar. The aluminum-containing precursor includes trimethylaluminum (TMA), triethylaluminium (TEA), or other suitable chemical. The gallium-containing precursor includes TMG, TEG, or other suitable chemical. The nitrogen-containing precursor includes ammonia, TBAm, phenyl hydrazine, or other suitable chemical. The suitable aluminum composition of the second III-V layer 102 can be referred to paragraphs addressing FIG. 2 of the present disclosure and is not repeated here for simplicity. In FIG. 11A, the aluminum composition can possess a graded profile as discussed in FIG. 2. All the aluminum-containing precursors used are identical except for the relative flow rate to achieve an intended aluminum grading profile. In some embodiments, the second III-V layer 102 has a thickness in a range from about 5 nm or less. In other embodiments, the second III-V layer 102 may include an AlGaAs layer, or an AlInP layer. The second III-V layer 102 includes a first surface 111 in contact with the underlying first III-V layer 101 and a second surface 112 away from the underlying first III-V layer 101 or opposite to the first surface 111. The second band gap of the second III-V layer 102 is not a constant throughout said layer. In some embodiments, the second band gap at the second surface is greater than the second band gap at the first surface.

Figure 11B:
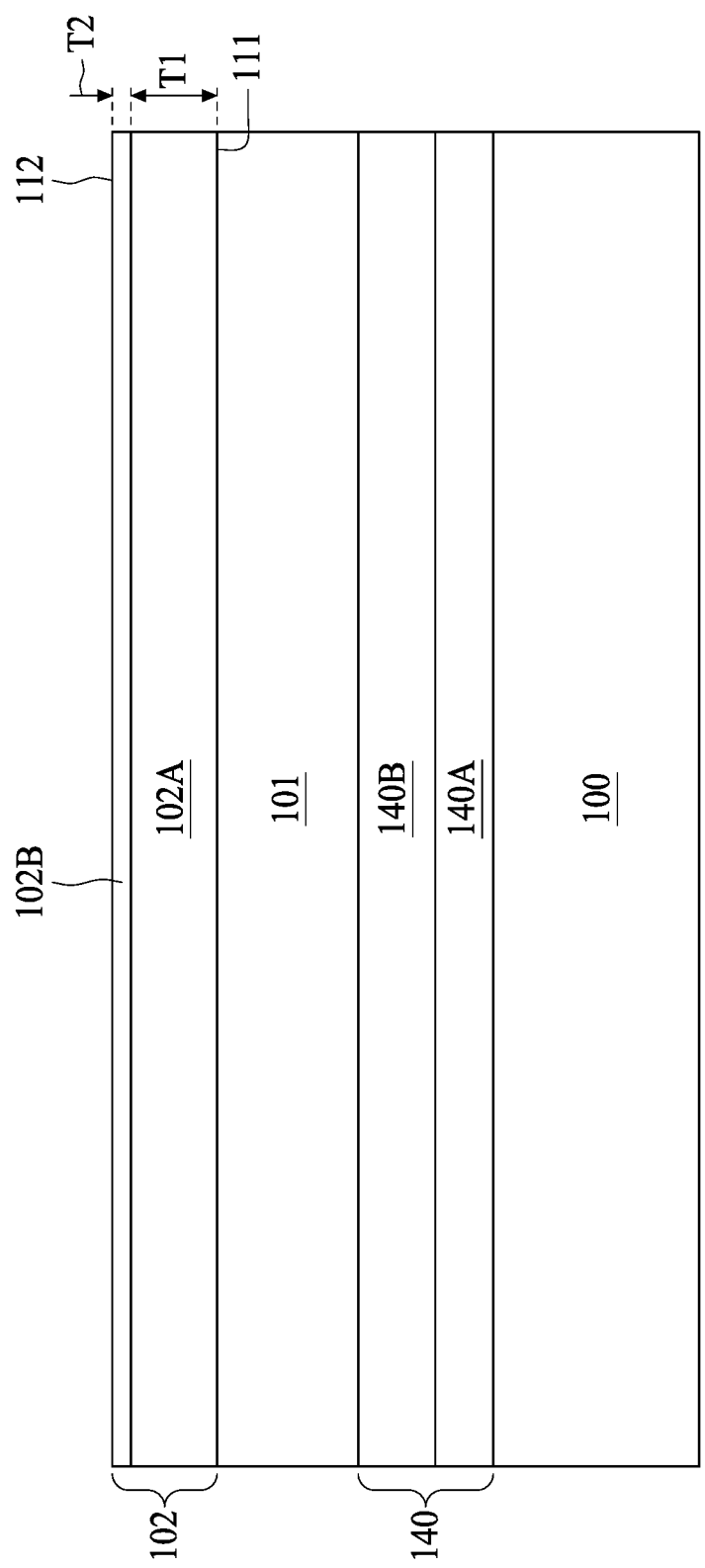
FIG. 11B shows a schematic cross sectional view of a semiconductor structure with another type of a III-V layer during an operation of fabrication, in according to some embodiments of the present disclosure.

Referring to FIG. 11B, FIG. 11B shows a schematic cross sectional view of a semiconductor structure 30 with one type of a III-V layer during an operation of fabrication, according to some embodiments of the present disclosure. In FIG. 11B, a second III-V layer 102 is formed over the first III-V layer 101. The second III-V layer 102 further includes a bilayer, that is, a bottom layer 102A and an upper layer 102B. In some embodiments, the bottom layer 102A and the upper layer 102B are epitaxially grown on the first III-V layer 101 by MOVPE using aluminum-containing precursor, gallium-containing precursor, and nitrogen-containing precursor under conditions, for example, a temperature of from 1000 to 1100 degrees Celsius and a pressure of from 50 to 100 mbar. The aluminum-containing precursor includes trimethylaluminum (TMA), triethylaluminium (TEA), or other suitable chemical. The gallium-containing precursor includes TMG, TEG, or other suitable chemical. The nitrogen-containing precursor includes ammonia, TBAm, phenyl hydrazine, or other suitable chemical. The suitable aluminum composition of the bottom layer 102A and the upper layer 102B can be referred to paragraphs addressing FIG. 4 of the present disclosure and is not repeated here for simplicity. In FIG. 11B, all the aluminum-containing precursors used are identical except for the relative flow rate to achieve an intended bilayer profile. The second III-V layer 102 includes a first surface 111 in contact with the underlying first III-V layer 101 and a second surface 112 away from the underlying first III-V layer 101 or opposite to the first surface 111. The second band gap of the second III-V layer 102 is not a constant throughout said layer especially a bilayer structure (i.e., 102A, 102B) is concurrently defining the second III-V layer 102. In some embodiments, the second band gap at the second surface is the band gap of the upper layer 102B, and the second band gap at the first surface is the band gap of the bottom layer 102A. In some embodiments, the second band gap at the second surface is greater than the second band gap at the first surface.

Figure 12:
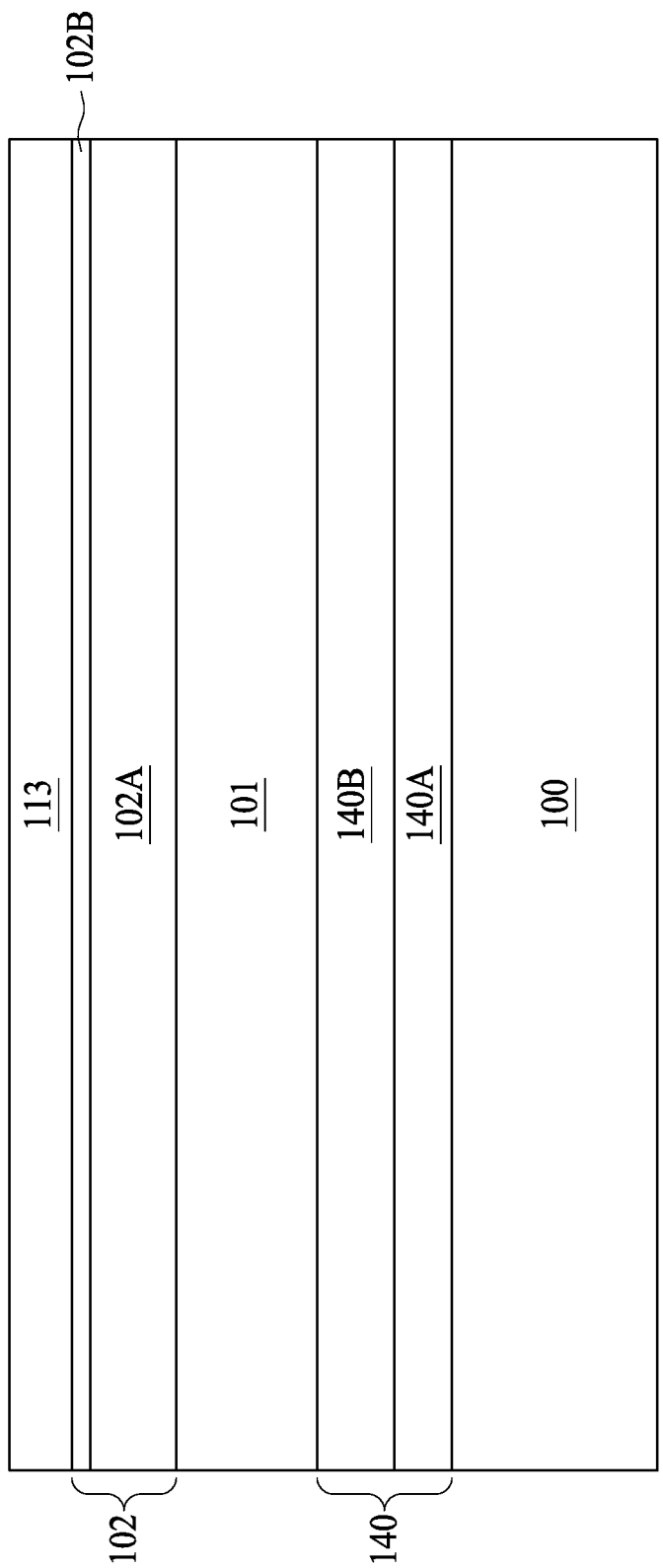
FIG. 12 to FIG. 20 show schematic cross-sectional views of a semiconductor structure and depict the sequence of operations for fabrication of the semiconductor structure, according to some embodiments of the present disclosure.
Figure 13:
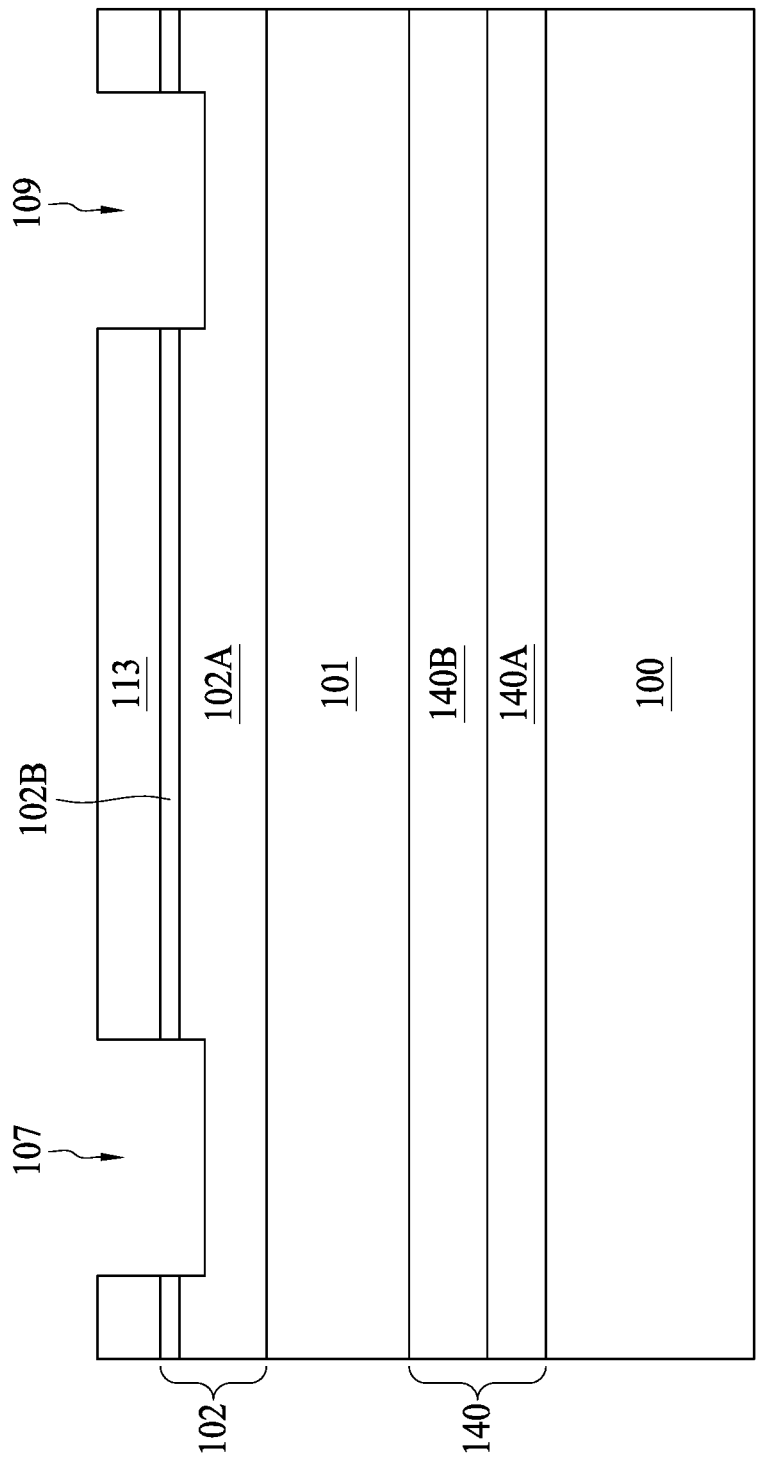

FIG. 12 to FIG. 20 show schematic cross-sectional views of a semiconductor structure 30 and depict the sequence of operations for fabrication of the semiconductor structure, according to some embodiments of the present disclosure. In FIG. 12, a capping layer 113 is formed over the second III-V layer 102. The capping layer 113 is deposited on a top surface of the second III-V layer 102, and over the top surface of the first III-V layer 101. The dielectric cap layer 113 has a thickness in a range from about 100 to about 5000 Å. In some embodiments, the capping layer 113 includes $SiO_2$ or $Si_3N_4$. In one example, the capping layer 113 is $Si_3N_4$ and is formed by performing a low pressure chemical vapor deposition (LPCVD) method without plasma using $SiH_4$ and $NH_3$ gases. An operation temperature is in a range of from about 650 degrees Celsius to about 800 degrees Celsius. An operation pressure is in a range of about 0.1 Torr and about 1 Torr. The capping layer 113 protects the underlying second III-V layer 102 from damage in the following processes having plasma. Next, as FIG. 13 shows, two openings 107' and 109' in the capping layer 113 are defined by lithography and etching processes to expose two openings in the second III-V layer 102, especially through the upper layer 102B and partially recessing the bottom layer 102A. Alternatively stated, a bottom of the two openings 107' and 109' exposes the bottom layer 102A of the second III-V layer 102.

Figure 14:
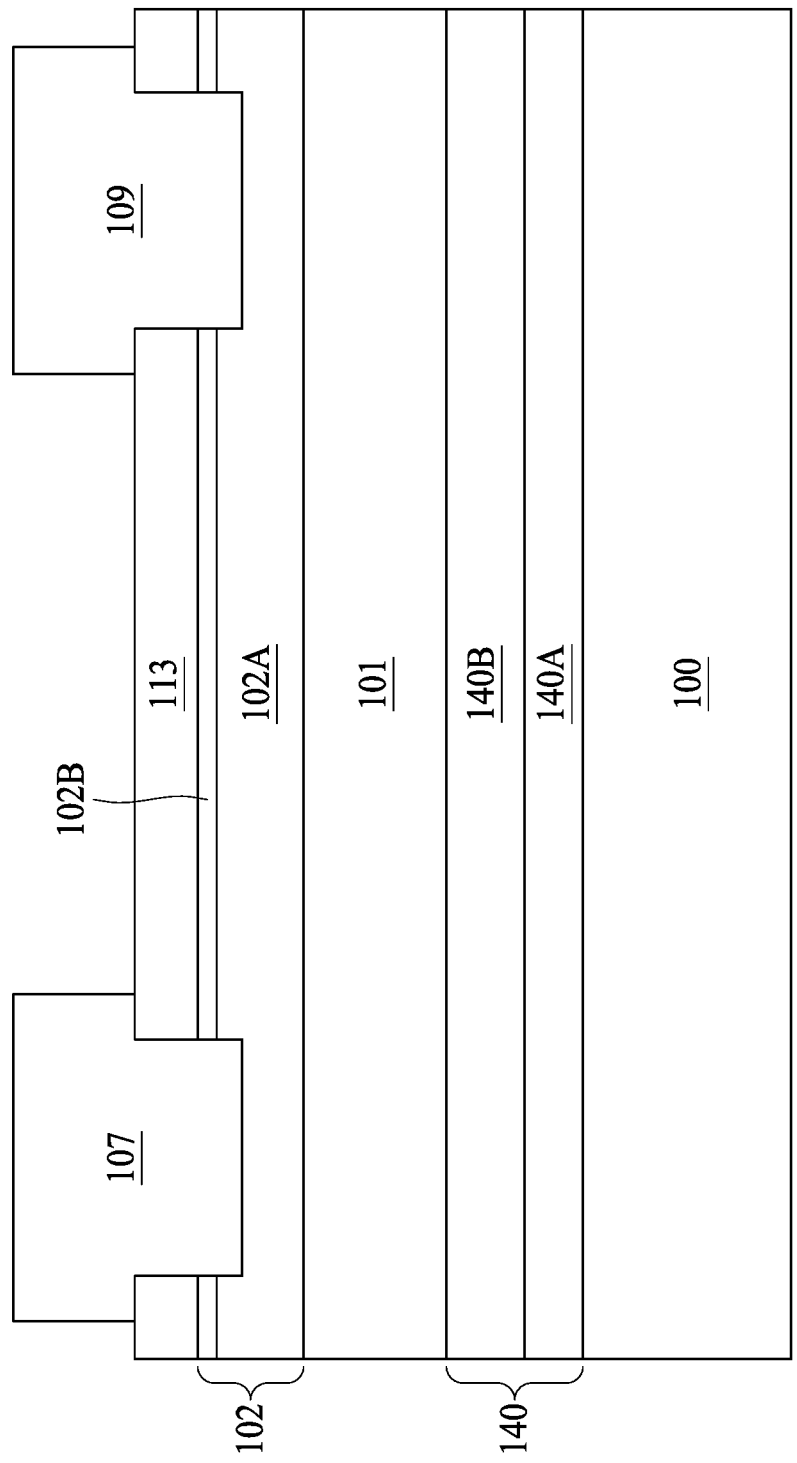

In FIG. 14, a source feature 107 and a drain feature 109 are formed in the two openings 107' and 109'. In some embodiments, a metal layer is deposited over the capping layer 113 which overfills the two openings 107' and 109' and contacts the bottom layer 102A of the second III-V layer 102. A photoresist layer (not shown) is formed over the metal layer and developed to form a feature over each of the two openings. The metal layer not covered by the feature of the photoresist layer is removed by a reactive ion etch (RIE) process that etches the exposed portions of the metal layer down to the underlying the capping layer 113. Two metal features 107 and 109 are generated after the etching process. The metal features 114 and 116 are configured as the source feature 107 or the drain feature 109 for the MISFET and/or the HEMT. The photoresist layer is removed after the formation of the metal features 107 and 109. The capping layer 113 protects the underlying second III-V layer 102 from damage during the etching process to form metal features 107 and 109.

In some embodiments, the metal layer of the metal features 107 and 109 includes one or more conductive materials. In at least one example, the metal layer is free of gold (Au) and comprises titanium (Ti), titanium nitride (TiN), or aluminum copper (AlCu) alloy. In another example, the metal layer includes a bottom Ti/TiN layer, an AlCu layer overlying the bottom Ti/TiN layer, and a top Ti layer overlying the AlCu layer. The formation methods of the metal layer include atomic layer deposition (ALD) or physical vapor deposition (PVD) processes. Without using Au in the metal features 107 and 109, the method 200 could also be implemented in the production line of integrated circuits on silicon substrate. The contamination concern from Au on the silicon fabrication process could be eliminated.

Figure 15:
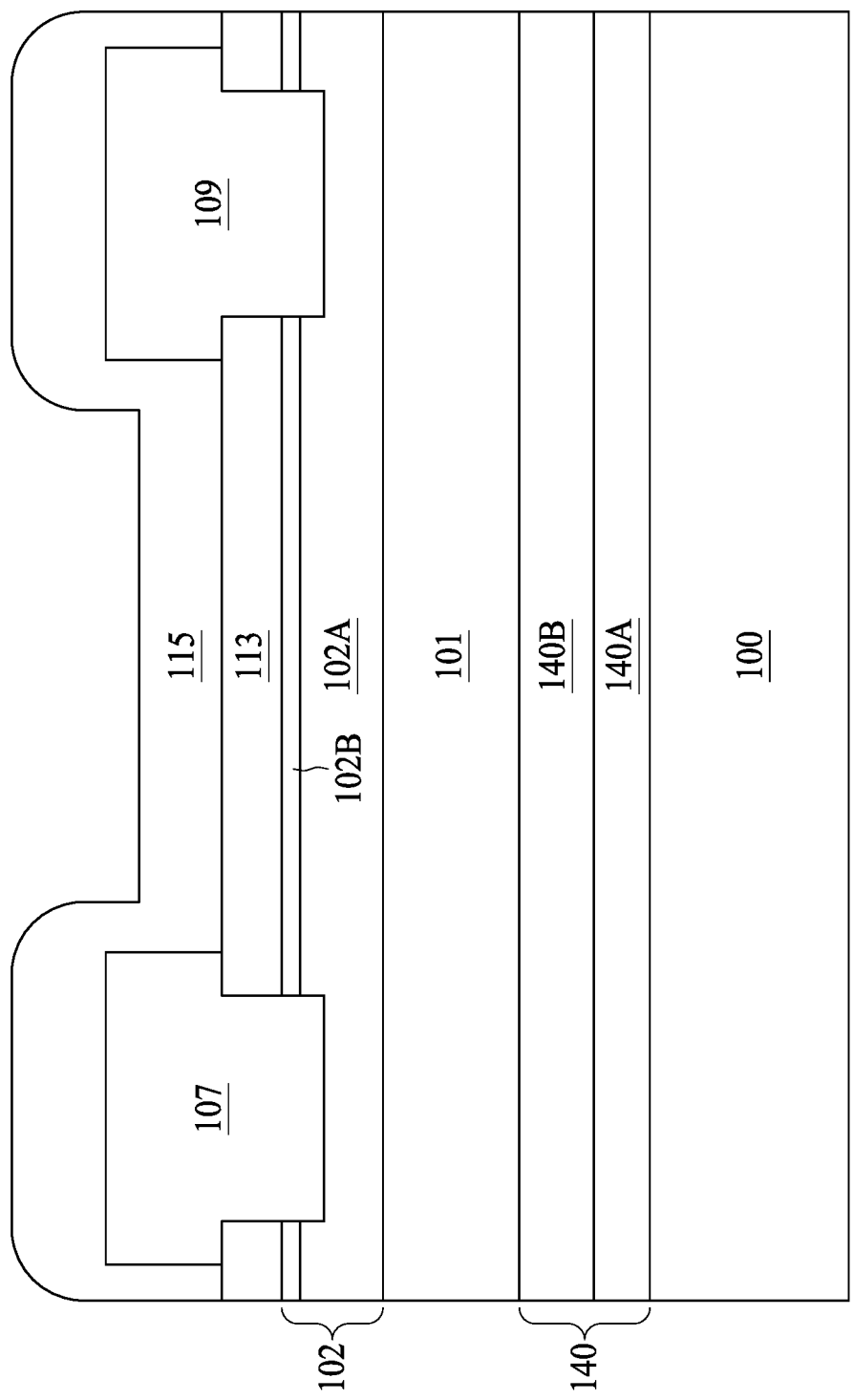

In FIG. 15, a protection layer 115 is optionally deposited on top surfaces of the metal features 107 and 109 and the capping layer 113. In some embodiments, the protection layer 115 includes dielectric materials such as $SiO_2$ or $Si_3N_4$. In one example, the protection layer is 115 $Si_3N_4$ and is formed by performing a plasma enhanced chemical vapor deposition (PECVD) operation.

Figure 16:
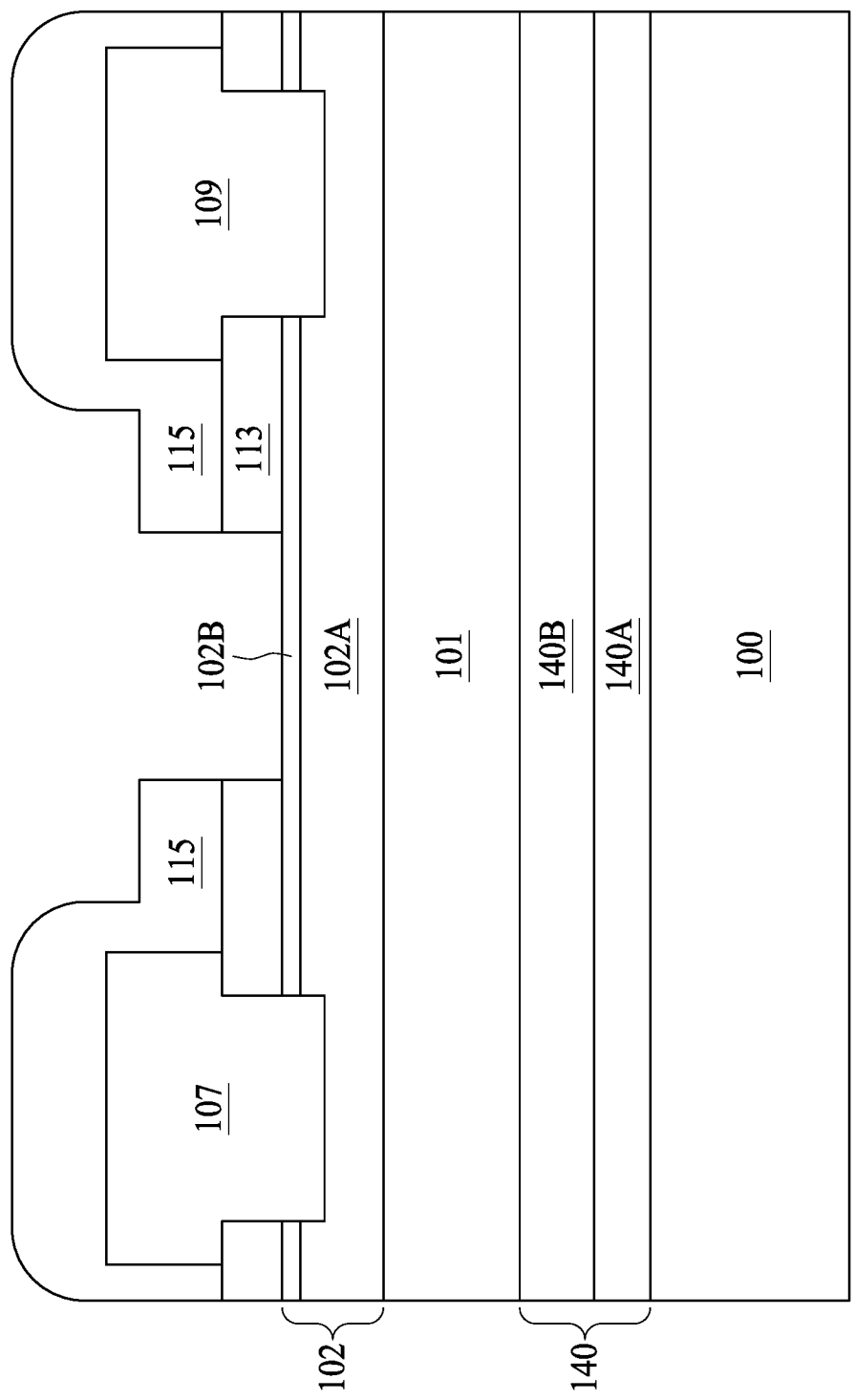

Referring to FIG. 16, FIG. 16 illustrates the formation of an opening 105A in the capping layer 113 and in the protection layer 115. Specifically, a patterned mask layer (not shown) is formed on a top surface of the capping layer 113 and an etching process is performed to remove a portion of the capping layer 113 (also remove a portion of the protection layer 115 if the protection layer exists). The opening 105A exposes a portion of the top surface of the second III-V layer 102. The opening 105A is configured as a location for the later gate electrode formation. It is important to note that, in this embodiment, the opening 105A is formed in a semiconductor structure of a MISFET or a HEMT.

Figure 17:
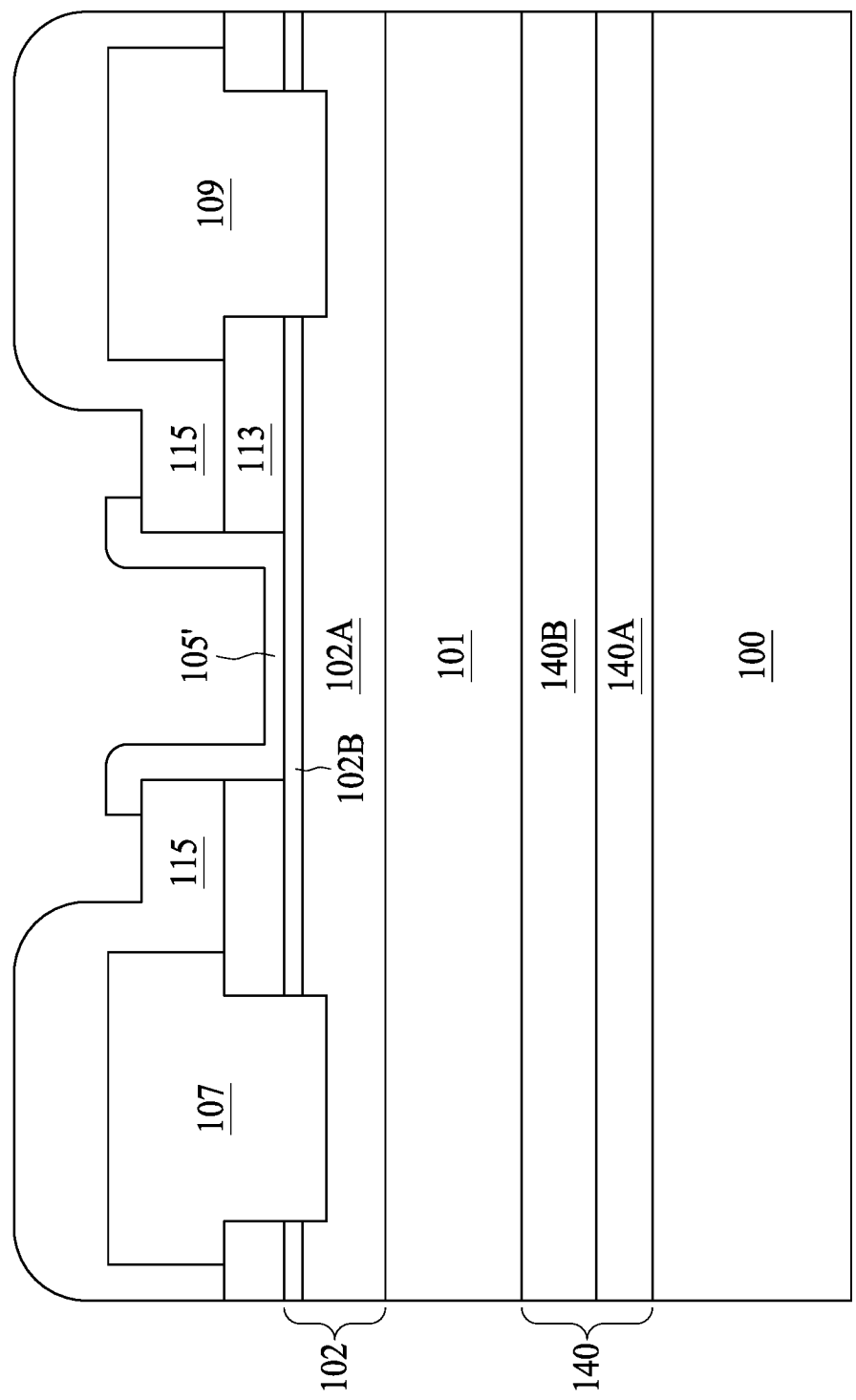

Referring to FIG. 17, FIG. 17 illustrates the semiconductor structure 30 after depositing a gate dielectric layer 105'. The gate dielectric layer 105' is deposited on the capping layer 113, along an interior surface of the opening 105A and on the exposed portion of the second III-V layer 102. The gate dielectric layer 105' is also deposited over the source feature and the drain feature. In some embodiments, the gate dielectric layer 105' is in a thickness range from about 3 nm to about 20 nm. In some examples, the gate dielectric layer 105' comprises silicon oxide, silicon nitride, gallium oxide, aluminum oxide, scandium oxide, zirconium oxide, lanthanum oxide or hafnium oxide. In one embodiment, the gate dielectric layer 105' is formed by an atomic layer deposition (ALD) method. The ALD method is based on the sequential use of a gas phase chemical process. The majority of ALD reactions use two chemicals, typically called precursors. These precursors react with a surface one-at-a-time in a sequential manner. By exposing the precursors to the growth surface repeatedly, the gate dielectric layer 105' is deposited. The ALD method provides a uniform thickness of the gate dielectric layer 105' with high quality. In one example, the gate dielectric layer 105' is zirconium oxide. In some embodiments, a first precursor includes tetrakis[ethylmethylamino]zirconium (TEMAZr) or zirconium chloride ($ZrCl_4$). In some embodiments, a second precursor includes oxygen in order to oxidize the first precursor material to form a monolayer. In some examples, the second precursor includes ozone ($O_3$), oxygen, water ($H_2O$), $N_2O$ or $H_2O$—$H_2O_2$. In other embodiments, the gate dielectric layer 105' is formed by a plasma enhanced chemical vapor deposition (PECVD) or a low pressure chemical vapor deposition (LPCVD).

Figure 18:
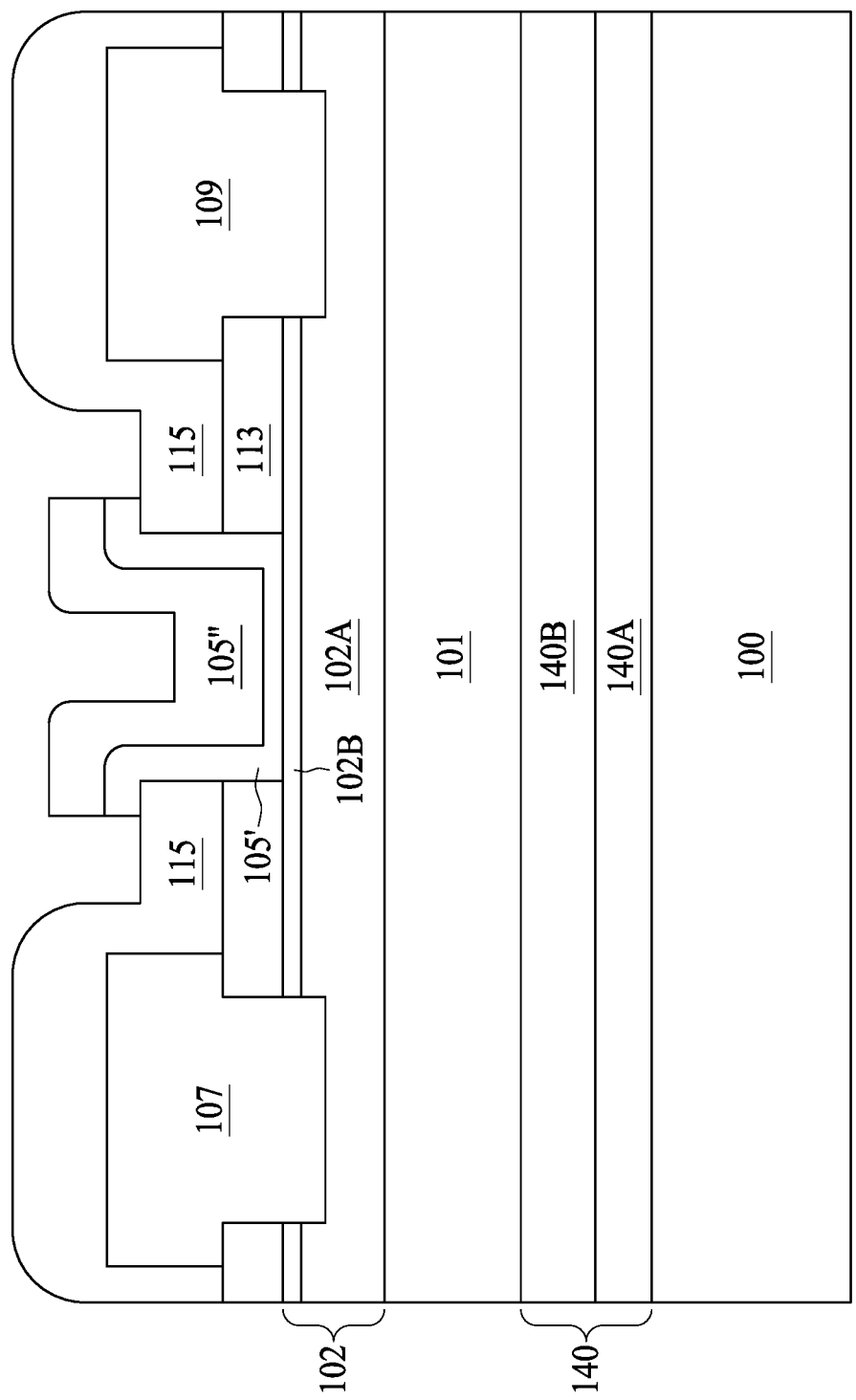

Referring to FIG. 18, FIG. 18 illustrates forming a conductive material layer 105" over the entire MISFET or HEMT. In various examples, the conductive material layer 105" includes a refractory metal or its compounds, e.g., titanium (Ti), titanium nitride (TiN), titanium tungsten (TiW) and tungsten (W). In another example, the conductive material layer 105" includes nickel (Ni), gold (Au) or copper (Cu). The conductive material layer 105" overfills the opening 105A of semiconductor structure 30. Subsequently, the conductive material layer 105" is patterned to form a gate electrode 105".

Figure 19:
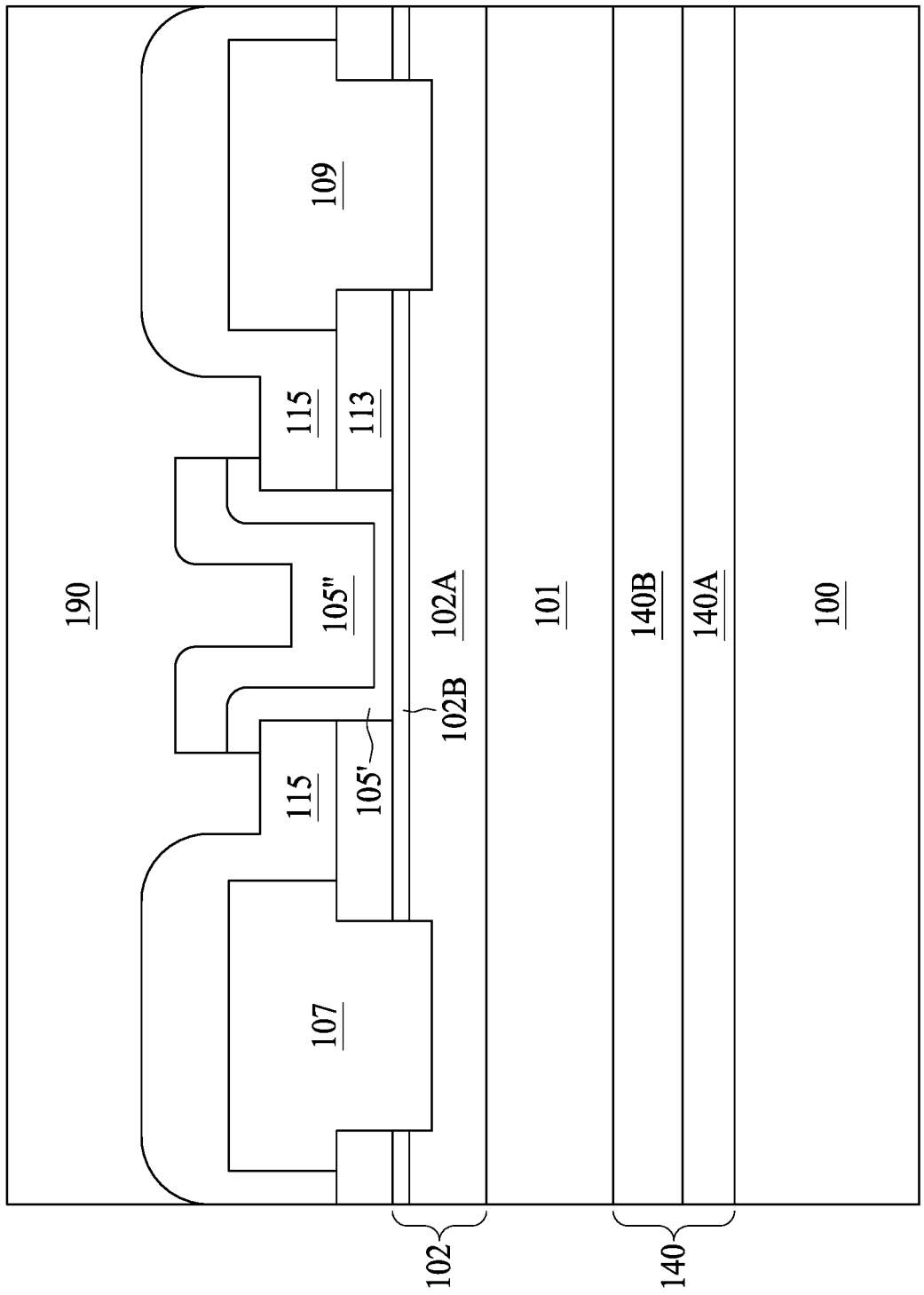
Figure 20:
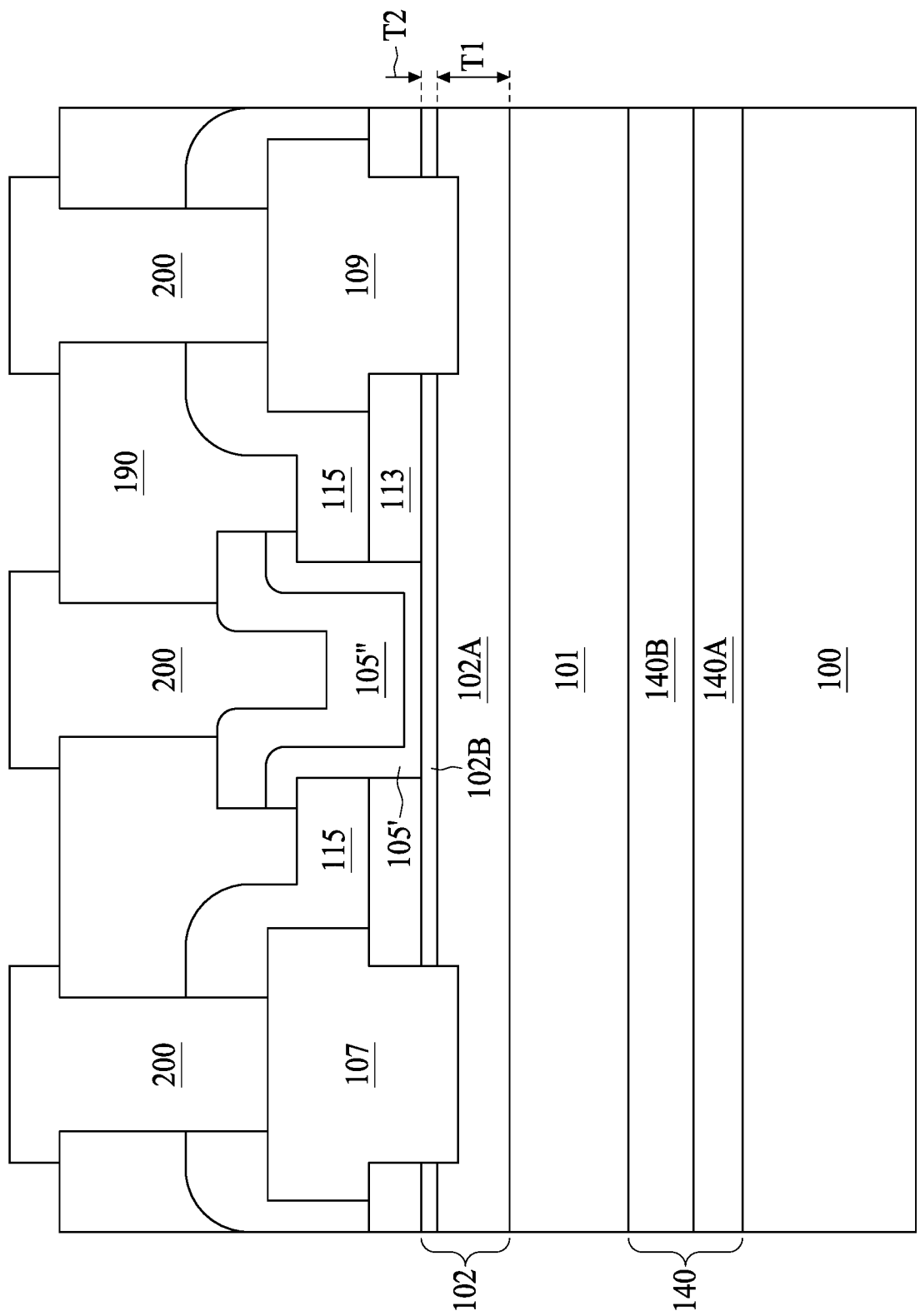

Referring to FIG. 19 and FIG. 20. FIG. 19 shows a formation of a dielectric layer 190 covering the gate electrode 105" and the protection layer 115 over the source/drain features 107, 109. In some embodiments, the dielectric layer can be low k dielectric or interlayer dielectric. In FIG. 20, conductive plugs 200 are formed over the gate electrodes 105" and the conductive features 107, 109 by lithography and metal sputtering techniques. Lithography and etching processes are performed on the dielectric layer 190 to define the conductive plugs 200. In some embodiments, the conductive plugs 200 include a conductive material layer that includes a refractory metal or its compounds, e.g., titanium (Ti), titanium nitride (TiN), titanium tungsten (TiW) and tungsten (W). In another example, the conductive plugs 200 includes nickel (Ni), gold (Au) or copper (Cu).

One embodiment in the present disclosure provides a semiconductor structure, including a substrate, a first III-V layer over the substrate, having a first band gap, and a second III-V layer over the first III-V layer, having a second band gap. The second III-V layer includes a first surface in contact with the first III-V layer and a second surface opposite to the first surface. The second band gap at the second surface is greater than the second band gap at the first surface.

One embodiment in the present disclosure provides a semiconductor structure, including a silicon substrate, a GaN layer over the silicon substrate, an aluminum (Al) containing layer over the GaN layer, and a gate structure over the aluminum-containing layer. An Al concentration of the Al containing layer in proximity to the GaN layer is different from an Al concentration of the Al containing layer in proximity to the gate structure.

One embodiment in the present disclosure provides a manufacturing method of a semiconductor structure. The method includes providing a substrate, forming a first III-V layer having a first band gap over the substrate, and forming a second III-V layer having a second band gap over the first III-V layer. The second III-V layer having a first surface in contact with the first III-V layer and a second surface opposite to the first surface. The second band gap at the second surface is greater than the second band gap at the first surface.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A high electron mobility transistor (HEMT) comprising:
   a silicon substrate;
   a first AlN layer disposed directly on the silicon substrate;
   a first AlGaN layer disposed directly on the first AlN layer;
   a second AlN layer disposed directly on the first AlGaN layer;
   a GaN channel layer having a first band gap disposed directly on the second AN layer; and
   a III-V donor-supply layer having a second band gap disposed directly between the GaN channel layer and a gate structure, such that the III-V donor-supply layer directly contacts the GaN channel layer and the gate structure, wherein the second band gap is different than the first band gap, and further wherein the III-V donor-supply layer is a second AlGaN layer that includes:
   a first surface of the second AlGaN layer that directly contacts the GaN channel layer, and
   a second surface of the second AlGaN layer opposite the first surface that directly contacts the gate structure, wherein an aluminum concentration of the second AlGaN layer increases throughout the second AlGaN layer according to a graded profile from the first surface to the second surface, such that the second band gap increases throughout the second AlGaN layer from the first surface to the second surface.

2. The HEMT of claim 1, wherein the gate structure includes a gate electrode and is free of a gate dielectric.

3. The HEMT of claim 1, further comprising a metal source feature that extends through a first portion of the III-V donor-supply layer and a metal drain feature that extends through a second portion of the III-V donor-supply layer, such that the gate structure is disposed between the metal source feature and the metal drain feature.

4. The HEMT of claim 1, wherein a first peak aluminum concentration is in the first AlGaN layer and a second peak aluminum concentration is in the second AlGaN layer.

5. The HEMT of claim 4, wherein the second AlGaN layer includes a first AlGaN sub-layer disposed over a second AlGaN sub-layer, wherein the second AlGaN sub-layer directly contacts the GaN channel layer and the second peak aluminum concentration is in the first AlGaN sub-layer.

6. The HEMT of claim 1, wherein first AlN layer has a first thickness and the second AlN layer has a second thickness, wherein the second thickness is less than the first thickness.

7. The HEMT of claim 1, wherein the second AlGaN layer has a first AlGaN sub-layer disposed directly on the GaN channel layer and a second AlGaN sub-layer disposed directly on the first AlGaN sub-layer, wherein the aluminum concentration of the first AlGaN sub-layer is less than the aluminum concentration of the second AlGaN sub-layer and a first thickness of the first AlGaN sub-layer is greater than a second thickness of the second AlGaN sub-layer.

8. The HEMT of claim 1, wherein the aluminum concentration increases in the second AlGaN layer from about 0.14 to about 0.18 at the first surface to about 0.35 to about 0.4 at the second surface.

9. The HEMT of claim 1, wherein the grading profile is a stair profile, a linear continuous profile, or a non-linear continuous profile.

10. A high electron mobility transistor (HEMT) comprising:
a substrate;
an undoped GaN channel layer disposed over the substrate;
a n-type doped AlGaN donor-supply bilayer that includes:
a n-type doped $Al_xGa_{(1-x)}N$ layer disposed directly on the undoped GaN channel layer, wherein X is a concentration of aluminum in the n-type doped $Al_xGa_{(1-x)}N$ layer and X is about 0.14 to about 0.18;
a n-type doped $Al_yGa_{(1-y)}N$ layer disposed directly on the n-type doped $Al_xGa_{(1-x)}N$ layer, wherein Y is a concentration of aluminum in the n-type doped $Al_yGa_{(1-y)}N$ layer and Y is about 0.23 to about 0.4; and
a gate structure disposed directly on the n-type doped $Al_yGa_{(1-y)}N$ layer, wherein Y is greater than X to achieve a first band gap of the n-type doped $Al_xGa_{(1-x)}N$ layer in proximity to the undoped GaN channel layer that is less than a second band gap of the n-type doped $Al_yGa_{(1-y)}N$ layer in proximity to the gate structure.

11. The HEMT of claim 10, wherein X is uniform throughout the $Al_xGa_{(1-x)}N$ layer and Y is uniform throughout the $Al_yGa_{(1-y)}N$ layer.

12. The HEMT of claim 10, wherein X is graded throughout the $Al_xGa_{(1-x)}N$ layer, such that X increases from the GaN channel layer to the $Al_yGa_{(1-y)}N$ layer.

13. The HEMT of claim 10, wherein Y is graded throughout the $Al_yGa_{(1-y)}N$ layer, such that Y increases from the $Al_xGa_{(1-x)}N$ layer to the gate structure.

14. The HEMT of claim 10, wherein the gate structure includes a gate electrode and is free of a gate dielectric.

15. The HEMT of claim 10, wherein X is about 0.16 and Y is about 0.37.

16. The HEMT of claim 10, further comprising:
a first AlN layer disposed directly on the substrate;
an AlGaN layer disposed directly on the first AlN layer;
a second AlN layer disposed directly on the first AlGaN layer; and
wherein the undoped GaN channel layer is disposed directly on the second AlN layer.

17. The HEMT of claim 10, wherein a thickness of the $Al_xGa_{(1-x)}N$ layer is greater than or equal to about 15 nm, and a thickness of the $Al_yGa_{(1-y)}N$ layer is less than or equal to about 5 nm.

18. A manufacturing method of a high electron mobility transistor (HEMT) comprising:
forming a first AlN layer directly on a silicon substrate;
forming a first AlGaN layer directly on the first AlN layer;
forming a second AlN layer directly on the first AlGaN layer;
forming a GaN channel layer having a first band gap directly on the second AN layer; and
forming a III-V donor-supply layer having a second band gap directly on the GaN channel layer, wherein the second band gap is different than the first band gap, and further wherein the III-V donor-supply layer is a second AlGaN layer, wherein:
a first surface of the second AlGaN layer directly contacts the GaN channel layer, and
a second surface opposite to the first surface, an aluminum concentration of the second AlGaN layer increases throughout the second AlGaN layer according to a graded profile from the first surface to the second surface, such that the second band gap increases throughout the second AlGaN layer according to a graded profile from the first surface to the second surface, such that the second band gap increases throughout the second AlGaN layer from the first surface to the second surface, and
forming a gate structure directly on the III-V donor-supply layer, such that the second surface of the second AlGaN layer directly contacts the gate structure.

19. The manufacturing method of the HEMT of claim 18, wherein the forming the III-V donor-supply layer includes varying a flow rate of an aluminum-containing precursor, such that the graded profile increases the aluminum throughout the second AlGaN layer from the first surface to the second surface.

20. The manufacturing method of the HEMT of claim 19, wherein the III-V donor-supply layer further includes gallium and nitrogen and the forming the III-V donor-supply layer further includes using a nitrogen-containing precursor and a gallium-containing precursor.

* * * * *